United States Patent
Chen et al.

(10) Patent No.: US 6,720,252 B2
(45) Date of Patent: Apr. 13, 2004

(54) METHOD OF DEEP CONTACT FILL AND PLANARIZATION FOR DUAL DAMASCENE STRUCTURES

(75) Inventors: Chun-Che Chen, Hsinchu (TW); Tza-Hao Wang, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/292,589

(22) Filed: Nov. 13, 2002

(65) Prior Publication Data

US 2004/0023484 A1 Feb. 5, 2004

(30) Foreign Application Priority Data

Jul. 30, 2002 (TW) ...................................... 91116950 A

(51) Int. Cl.[7] .......................................... H01L 21/4763
(52) U.S. Cl. ...................................... 438/636; 438/780
(58) Field of Search ................................ 438/623–624, 438/636–638, 666, 672, 687, 763, 780, 782

(56) References Cited

U.S. PATENT DOCUMENTS

| | | | | |
|---|---|---|---|---|
| 6,300,235 B1 | * | 10/2001 | Feldner et al. | 438/618 |
| 6,323,123 B1 | * | 11/2001 | Liu et al. | 438/638 |
| 6,365,529 B1 | * | 4/2002 | Hussein et al. | 438/780 |
| 6,372,631 B1 | * | 4/2002 | Wang et al. | 438/624 |
| 6,372,635 B1 | * | 4/2002 | Wang et al. | 438/638 |
| 6,383,919 B1 | * | 5/2002 | Wang et al. | 438/638 |
| 6,391,757 B1 | * | 5/2002 | Huang et al. | 438/597 |
| 6,424,039 B2 | * | 7/2002 | Wang et al. | 257/750 |
| 6,426,298 B1 | * | 7/2002 | Chen et al. | 438/699 |
| 6,429,116 B1 | * | 8/2002 | Wang et al. | 438/623 |
| 6,444,557 B1 | * | 9/2002 | Biolsi et al. | 438/597 |
| 6,514,860 B1 | * | 2/2003 | Okada et al. | 438/687 |
| 2002/0106889 A1 | * | 8/2002 | Wang et al. | 438/618 |

* cited by examiner

*Primary Examiner*—David Nelms
*Assistant Examiner*—David Vu
(74) *Attorney, Agent, or Firm*—Finnegan, Henderson, Farabow, Garrett & Dunner

(57) ABSTRACT

A method for manufacturing a semiconductor device includes providing a dielectric layer over a substrate, providing a first photoresist layer over the dielectric layer, patterning and defining the first photoresist layer, etching the first photoresist layer and the dielectric layer to form a plurality of vertical openings, removing the first photoresist layer, depositing a second photoresist layer over the dielectric layer, wherein the second photoresist layer fills the plurality of vertical openings, removing only a portion of the second photoresist layer deposited over the dielectric layer, wherein the second photoresist layer has a first substantially uniform thickness over the dielectric layer, depositing an anti-reflection coating layer over the second photoresist layer, providing a third photoresist layer over the anti-reflection coating layer, patterning and defining the third photoresist layer, and etching the anti-reflection coating layer and the second photoresist layer to form a plurality of trenches in the dielectric layer.

18 Claims, 6 Drawing Sheets

METHOD OF DEEP CONTACT FILL AND PLANARIZATION FOR DUAL DAMASCENE STRUCTURES

FIELD OF THE INVENTION

The invention pertains in general to a method for manufacturing a semiconductor device and, more particularly, to a method for providing an anti-reflective coating layer having a uniform thickness during a dual damascene process.

BACKGROUND OF THE INVENTION

In the semiconductor manufacturing process, one or more metal layers are formed to serve as interconnects between active devices formed on a semiconductor wafer and the outside world. The metal layers are separated from each other by insulating layers. Damascene is an interconnect fabrication process that provides a plurality of horizontal grooves on an insulating layer. The grooves are filled with metal to form conductive lines. Dual damascene is a multi-level interconnect process that, in addition to forming conductive lines, forms conductive vias that connect the metal layers. The conductive vias also connect other conductive regions, such as the gate, source and drain regions, of the active devices to one or more of the metal layers.

In a conventional dual damascene process, a first photoresist is generally provided over an insulating layer. A first mask with patterns of vias is then provided over the first photoresist to define and pattern the first photoresist. The insulating layer is etched, and vertical openings for the vias are formed in the insulating layer. After the first photoresist is removed, the insulating layer is coated with a layer of anti-reflection coating ("ARC") and the vertical openings are filled with the ARC material. A second photoresist is provided over the ARC layer. A second mask with patterns of the conductive lines is used to define and pattern the second photoresist. After the second photoresist is defined and developed, the second photoresist, ARC layer, and insulating layer are etched. Horizontal grooves for the conductive lines are formed in the ARC layer and on the upper portion of the insulating layer. The second photoresist is stripped, and the ARC layer, including the ARC material provided in the vertical openings, is removed. The grooves and vertical openings are then filled with metal, such as tungsten or copper. The resulting surface is then planarized through chemical-mechanical polishing ("CMP").

During the photolithographic process, light passes through a photoresist film down to the semiconductor substrate, where the light is reflected back up through the photoresist. The reflected light could interfere with the adjacent photoresist, adversely affecting the control of the critical dimension ("CD") of the manufacturing process. The ARC material is used to suppress unintended light reflection from a reflective surface that is beneath the photoresist. However, when the ARC material is used to fill the vertical openings, the local thickness of the ARC layer over the top surface of the underlying layer varies, depending upon the via pattern and density. As a result, the ARC layer may exhibit non-uniformity in its thickness across the underlying layer as shown in FIG. 1.

Referring to FIG. 1, an ARC layer 102 is provided over an underlying layer 100, which includes a plurality of vertical openings 104 filled with the ARC material. The ARC layer 102 provided over the region of the underlying layer 100 having a dense via pattern region is thinner compared to the region of the layer 100 having an isolated via pattern region. The non-uniformity of the ARC layer thickness may result in unintended increase in the CD.

More specifically, referring to FIG. 2A, a dielectric layer 106 is formed over a substrate 101 with a plurality of semiconductor devices (not shown). A first layer of patterned photoresist ("PR", not shown) is then provided over dielectric layer 106. The first patterned PR layer is used as a mask to form a plurality of via openings 108 in dielectric layer 106. After removal of the first patterned PR layer, a bottom anti-reflective coating ("BARC") layer 110 is formed over substrate 101, and via openings 108 are filled with BARC layer 110. The thickness of BARC layer 110 across the top surface of the underlying dielectric layer 106 varies due to changes of density of via openings 108. Specifically, BARC layer 110 provided over region 102 having denser via openings is thinner compared to region 104 having less dense via openings.

Referring to FIG. 2B, a second PR layer 112 is provided over BARC layer 110. After second PR layer 112 is defined and developed, layer 112 and BARC layer 110 are etched to form a plurality of openings 114 to define trenches generated thereafter. Patterned PR layer 112 is then used as a mask to remove exposed BARC layer 110. Because BARC layer 110 is thicker in region 104 than in region 102, to completely remove the exposed BARC layer 110 of openings 114 in region 104, etching time must be increased. However, increasing etching time results in widening of openings 114 in region 102 from dimension "a" to "b".

Referring to FIG. 2C, a plurality of trenches 116 are formed by further etching dielectric layer 106, wherein PR layer 112 is used as a mask. PR layer 112 and BARC layer 110 over dielectric layer 106 and in via openings 108 are removed. Next, via openings 108 and trenches 116 are filled with conductive material 118 to complete the dual damascene process. Again, unintended deviation of CD of trenches 116 from "c" to "d" in region 102 will occur, and this phenomenon may lead to electrical shorts between adjacent lines, and even to device failure.

SUMMARY OF THE INVENTION

In accordance with the invention, there is provided a method for manufacturing a semiconductor device that includes providing a dielectric layer over a substrate, providing a first photoresist layer over the dielectric layer, patterning and defining the first photoresist layer, etching the first photoresist layer and the dielectric layer to form a plurality of vertical openings, removing the first photoresist layer, depositing a second photoresist layer over the dielectric layer, wherein the second photoresist layer fills the plurality of vertical openings, removing only a portion of the second photoresist layer deposited over the dielectric layer, wherein the second photoresist layer has a first substantially uniform thickness over the dielectric layer, depositing an anti-reflection coating layer over the second photoresist layer, providing a third photoresist layer over the anti-reflection coating layer, patterning and defining the third photoresist layer, and etching the anti-reflection coating layer and the second photoresist layer to form a plurality of trenches in the dielectric layer.

Also in accordance with the present invention, there is provided a method of manufacturing a dual damascene device that includes forming a plurality of active devices over a substrate, providing a layer of dielectric material over the active devices and the substrate, providing a plurality of vertical openings in the layer of dielectric material, wherein at least one of the plurality of vertical openings extends through to one of the plurality of active devices, depositing a first photoresist layer over the layer of dielectric material, the first photoresist layer filling the plurality of vertical openings, etching the first photoresist layer such that the first photoresist layer has a first substantially uniform thickness over the dielectric layer, and depositing an anti-reflection coating layer over the first photoresist layer.

In accordance with the present invention, there is additionally provided a method of manufacturing a dual damascene device that includes forming a plurality of active devices over a substrate, providing a layer of dielectric material over the active devices and the substrate, providing a plurality of vertical openings in the layer of dielectric material, wherein at least one of the plurality of vertical openings extends through to one of the plurality of active devices, depositing a first photoresist layer over the layer of dielectric material, the first photoresist layer filling the plurality of vertical openings, etching the first photoresist layer such that the first photoresist layer has a first substantially uniform thickness over the dielectric layer, depositing an anti-reflection coating layer over the first photoresist layer, providing a second photoresist layer over the anti-reflection coating layer, patterning and defining the second photoresist layer, etching the anti-reflection coating layer and the first photoresist layer to form a plurality of trenches in the layer of dielectric material, removing the first photoresist layer, the anti-reflection coating layer and the second photoresist layer, and providing metal to the plurality of vertical openings and plurality of trenches.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

FIGS. 3A–3F are cross-sectional views showing the fabrication steps of a dual damascene process consistent with one embodiment of the present invention.

Figure 1:
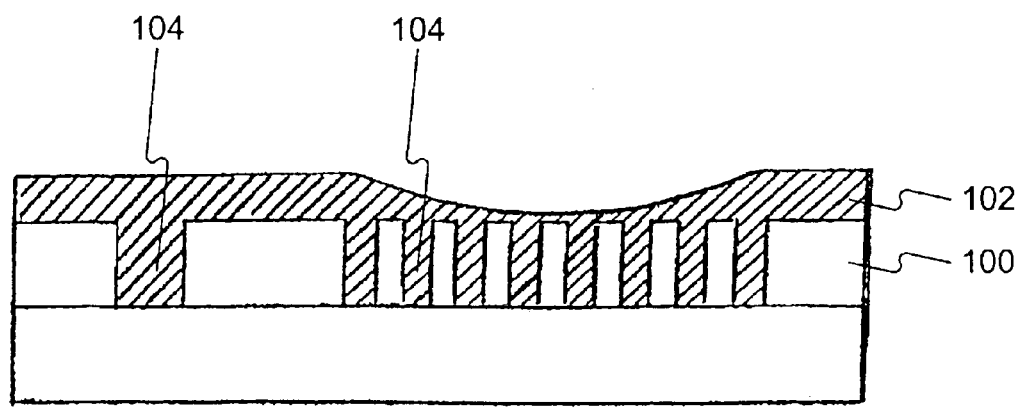
FIG. 1 is a cross-sectional view of a conventional semiconductor device.
Figure 2A:
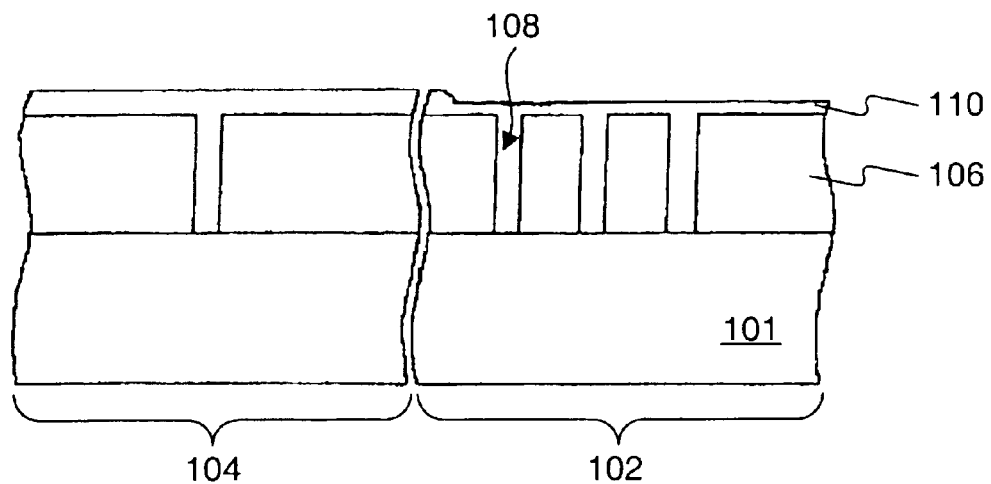
FIGS. 2A–2C are cross-sectional views of a conventional semiconductor device.
Figure 2B:
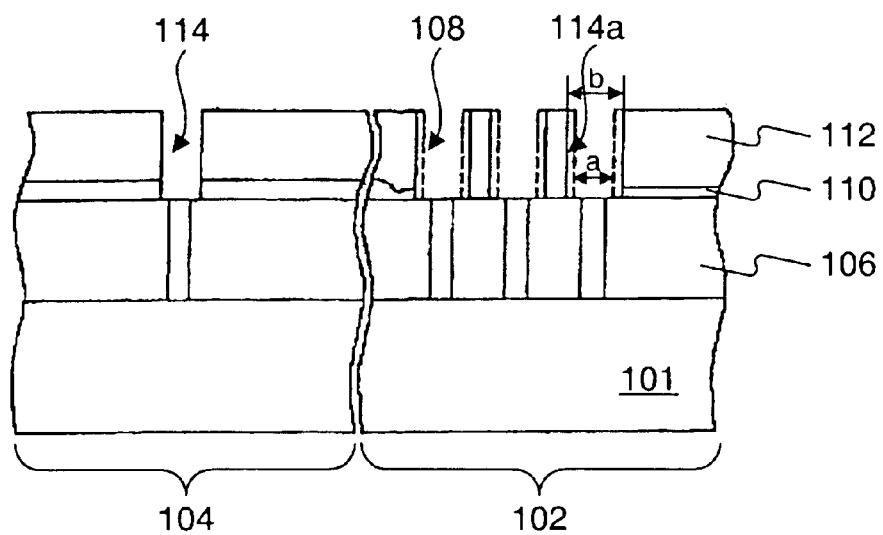
Figure 2C:
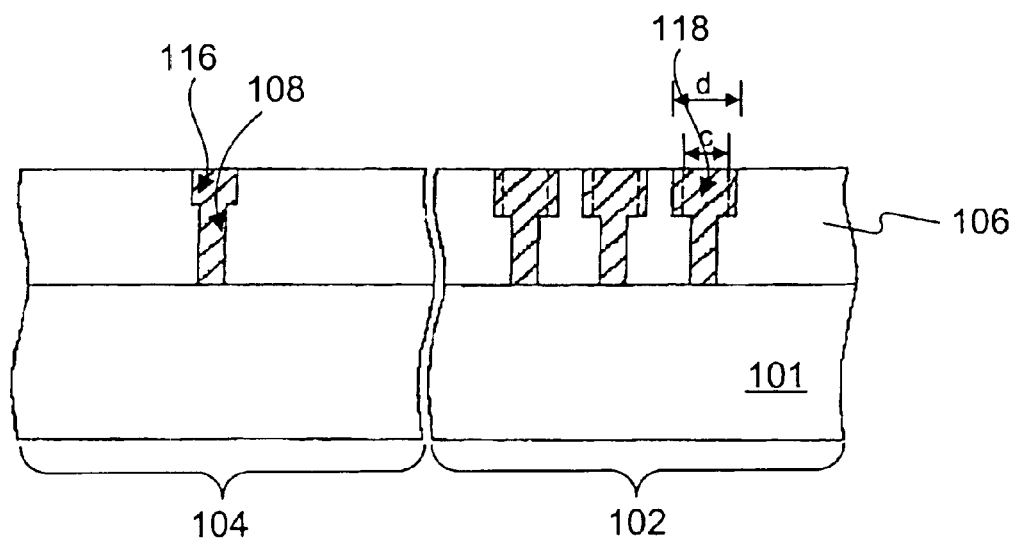
Figure 3A:
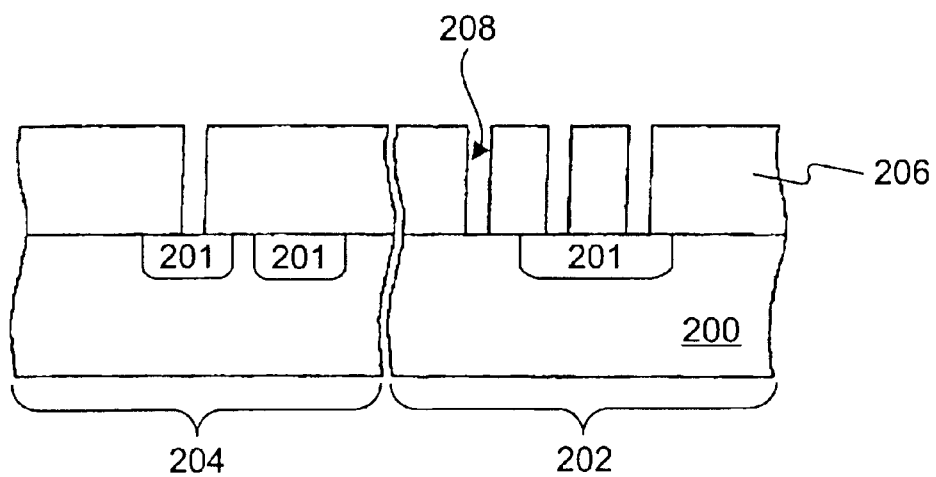
FIGS. 3A–3F are cross-sectional views of the fabrication steps of a dual damascene process consistent with one embodiment of the present invention.

Referring to FIG. 3A, the process begins with providing a substrate 200. Substrate 200 has formed therein a plurality of active devices 201. For simplicity, details of the plurality of active devices 201 are not shown. A layer of dielectric material 206 is deposited over the substrate 200. In one embodiment, the layer of dielectric material 206 may be composed of silicon oxide, silicon nitride, silicon oxynitride, phosphosilicate glass ("PSG"), boro-phosphosilicate glass ("BPSG"), or low k dielectrics (i.e., dielectric constant <4). Deposition of the dielectric layer 206 may be performed by chemical vapor deposition ("CVD") or spin coating.

A first photoresist (not shown) is provided over the layer of dielectric material 206. A first mask (not shown) with patterns of vias is provided over the first photoresist to define and pattern the first photoresist. The first photoresist and layer of dielectric material 206 are anisotropically etched, forming vertical openings 208 in the layer of dielectric material 206. In one aspect, at least one of the vertical openings 208 extends through the layer of dielectric material 206 and reaches one of active devices 201 formed within substrate 200. The first photoresist is then removed. The density of openings 208 is greater in a region 202 than in a region 204.

Figure 3B:
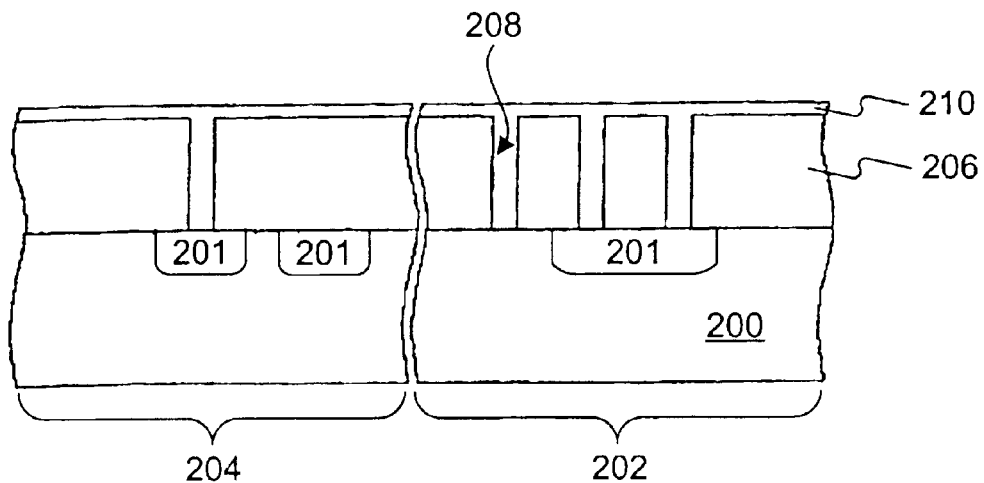

Referring to FIG. 3B, a second photoresist 210 is provided over the layer of dielectric material 206. The vertical openings 208 are also filled with the second photoresist material 210. Unlike the conventional fabrication process in which an ARC material is used to fill the vertical openings 208, the second photoresist 210 provides a substantially uniform thickness across the entire layer of dielectric material 206, including regions 202 and 204, regardless of the pattern, density or dimension of the vertical openings 208 in the underlying layer of dielectric material 206. The second photoresist 210 has an initial thickness of about 4,000 Angstroms to 6,000 Angstroms. In addition, the second photoresist 210 can be easily removed from the vertical openings 208 by a conventional etching process.

Dry etching is performed to partially remove the second photoresist 210 so that at least a small portion of the second photoresist 210 remains on the surface of the layer of dielectric material 206 to ensure that the second photoresist 210 exhibits a substantially uniform thickness. One example of a dry etching process that may be used is reactive ion etching. The thickness of the remaining second photoresist 210 is process dependent. In one embodiment, the remaining second photoresist has a thickness of about 100 Angstroms to 1000 Angstroms. The thickness of the remaining second, photoresist 210 may be controlled by selecting the photoresist etching time and photoresist material.

Figure 3C:
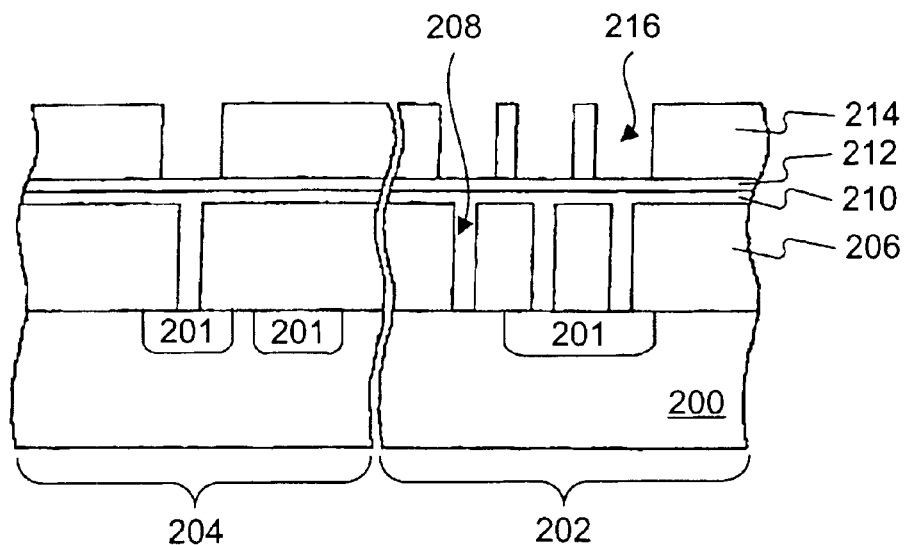

Referring to FIG. 3C, a layer of ARC 212 is deposited over the remaining second photoresist 210. The ARC layer 212 may be a polyimide and has a thickness of about 500 Angstroms to 1,500 Angstroms. Deposition of the ARC layer 212 is performed by, for example, spin coating. Because the surface of the remaining second photoresist 210 is already substantially planar and uniform in thickness, the ARC layer 212 is likewise substantially planar and has a substantially uniform thickness in regions 202 and 204. The dual damascene process continues with forming trenches. Specifically, a third photoresist 214 is provided over the ARC layer 212. A second mask (not shown) with patterns of conductive lines is used to define and pattern the third photoresist 214. After the third photoresist 214 is defined and developed, etching follows by using the defined and patterned third photoresist 214 as a mask to form trench openings 216.

Figure 3D:
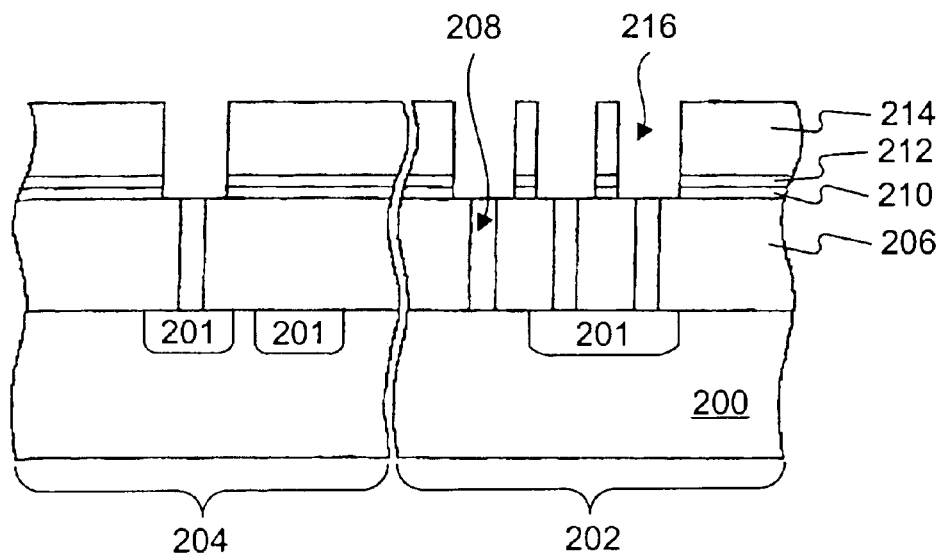

Referring to FIG. 3D, the ARC layer 212 and the remaining second photoresist 210 in the trench openings 216 are removed until the surface of the layer of dielectric material 206 is exposed. Removal of the the ARC layer 212 and the remaining second photoresist 210 is performed by a dry etching process, such as reactive ion etching.

Figure 3E:
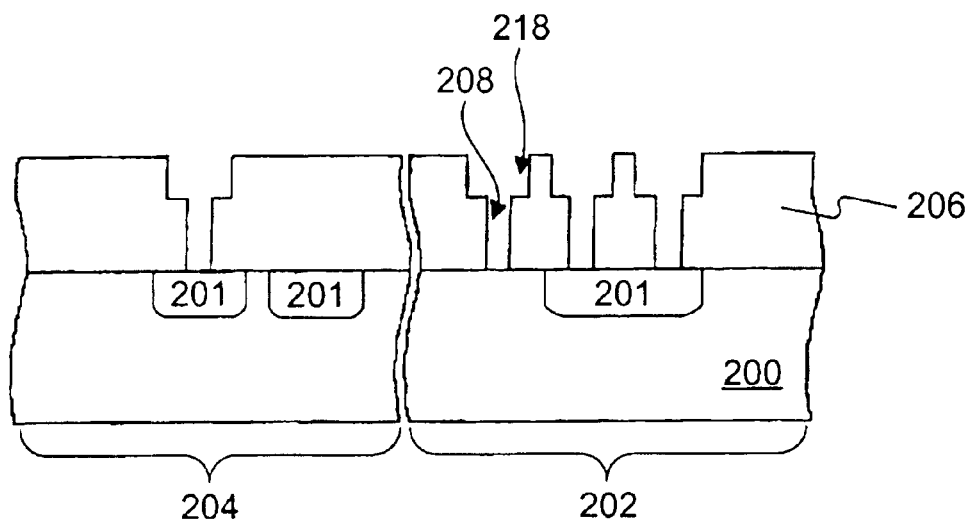

Referring to FIG. 3E, the layer of dielectric material 206 is etched to form trenches 218. The third photoresist 214, the ARC layer 212 and the remaining second photoresist 210 both over and in the layer of dielectric material 206 are stripped.

Figure 3F:
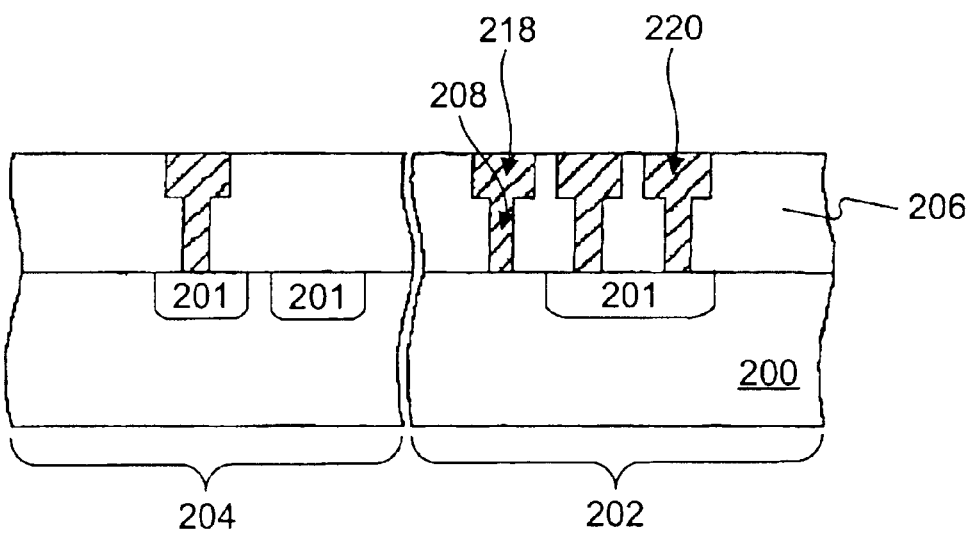

Referring to FIG. 3F, trenches 218 and vertical openings 208 are then filled with metal 220, such as tungsten or copper, through physical vapor deposition, CVD, or plating. The resulting surface is then planarized by CMP to form a dual damascene structure.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device, comprising:
    providing a dielectric layer over a substrate;
    providing a first photoresist layer over the dielectric layer;
    patterning and defining the first photoresist layer;
    etching the first photoresist layer and the dielectric layer to form a plurality of vertical openings;
    removing the first photoresist layer;
    depositing a second photoresist layer over the dielectric layer, wherein the second photoresist layer fills the plurality of vertical openings;
    removing only a portion of the second photoresist layer deposited over the dielectric layer, wherein the second photoresist layer has a first substantially uniform thickness over the dielectric layer;
    depositing an anti-reflection coating layer over the second photoresist layer;
    providing a third photoresist layer over the anti-reflection coating layer;
    patterning and defining the third photoresist layer; and
    etching the anti-reflection coating layer and the second photoresist layer to form a plurality of trenches in the dielectric layer.

2. The method as claimed in claim 1, wherein the dielectric layer comprises silicon oxide, silicon nitride, silicon oxynitride, phosphosilicate glass, boro-phospho silicate glass, or low k dielectrics.

3. The method as claimed in claim 1, wherein the step of removing only a portion of the second photoresist layer comprises dry etching the second photoresist layer.

4. The method as claimed in claim 1, wherein the first substantially uniform thickness of the second photoresist is between 100 and 1,000 Angstroms.

5. The method as claimed in claim 1, wherein the first substantially uniform thickness may be controlled by selecting a photoresist etching time.

6. The method as claimed in claim 1, wherein the step of etching the anti-reflection coating layer and the second photoresist layer comprises dry etching.

7. The method as claimed in claim 1, wherein the step of etching the dielectric layer comprises anisotropic etching.

8. A method of manufacturing a dual damascene device, comprising:
    forming a plurality of active devices in a substrate;
    providing a layer of dielectric material over the active devices and the substrate;
    providing a plurality of vertical openings in the layer of dielectric material, wherein at least one of the plurality of vertical openings extends through to one of the plurality of active devices;
    depositing a first photoresist layer over the layer of dielectric material, the first photoresist layer filling the plurality of vertical openings;
    etching the first photoresist layer such that the first photoresist layer has a first substantially uniform thickness over the dielectric layer; and
    depositing an anti-reflection coating layer over the first photoresist layer.

9. The method as claimed in claim 8, further comprising,
    providing a second photoresist layer over the anti-reflection coating layer;
    patterning and defining the second photoresist layer; and
    etching the anti-reflection coating layer and the first photoresist layer to form a plurality of trenches in the layer of dielectric material.

10. The method as claimed in claim 8, wherein the layer of dielectric material comprises silicon oxide, silicon nitride, silicon oxynitride, phosphosilicate glass, boro-phospho silicate glass, or low k dielectrics.

11. The method as claimed in claim 8, wherein the step of etching the first photoresist layer comprises dry etching the first photoresist layer.

12. The method as claimed in claim 8, wherein the first substantially uniform thickness may be controlled by selecting a photoresist etching time.

13. The method as claimed in claim 9, wherein the step of etching the anti-reflection coating layer and the first photoresist layer comprises anisotropic etching.

14. A method of manufacturing a dual damascene device, comprising:
    forming a plurality of active devices in a substrate;
    providing a layer of dielectric material over the active devices and the substrate;
    providing a plurality of vertical openings in the layer of dielectric material, wherein at least one of the plurality of vertical openings extends through to one of the plurality of active devices;
    depositing a first photoresist layer over the layer of dielectric material, the first photoresist layer filling the plurality of vertical openings;
    etching the first photoresist layer such that the first photoresist layer has a first substantially uniform thickness over the dielectric layer;
    depositing an anti-reflection coating layer over the first photoresist layer;
    providing a second photoresist layer over the anti-reflection coating layer;
    patterning and defining the second photoresist layer;
    etching the anti-reflection coating layer and the first photoresist layer to form a plurality of trenches in the layer of dielectric material;
    removing the first photoresist layer, the anti-reflection coating layer and the second photoresist layer; and
    providing metal to the plurality of vertical openings and plurality of trenches.

15. The method as claimed in claim 14, wherein the layer of dielectric material comprises silicon oxide, silicon nitride, silicon oxynitride, phosphosilicate glass, boro-phospho silicate glass, or low k dielectrics.

16. The method as claimed in claim 14, wherein the step of etching the first photoresist layer comprises dry etching the first photoresist layer.

17. The method as claimed in claim 14, wherein the first substantially uniform thickness may be controlled by selecting a photoresist etching time.

18. The method as claimed in claim 14, wherein the step of etching the anti-reflection coating layer and the first photoresist layer comprises anisotropic etching.

* * * * *